(12) United States Patent
Hierholzer et al.

(10) Patent No.: US 7,708,584 B2
(45) Date of Patent: May 4, 2010

(54) SEMICONDUCTOR CIRCUIT ARRANGEMENT

(75) Inventors: Martin Hierholzer, Moehnesee (DE); Patrick Baginski, Oelde (DE); Michael Hornkamp, Waltringen (DE); Uwe Jansen, Werl (DE)

(73) Assignee: Infineon Technologies AG, Neubiberg (DE)

( * ) Notice: Subject to any disclaimer, the term of this patent is extended or adjusted under 35 U.S.C. 154(b) by 46 days.

(21) Appl. No.: 11/756,072

(22) Filed: May 31, 2007

(65) Prior Publication Data

US 2007/0278669 A1    Dec. 6, 2007

(30) Foreign Application Priority Data

May 31, 2006    (DE) ................. 10 2006 025 453

(51) Int. Cl.
*H01R 13/00* (2006.01)
(52) U.S. Cl. .................. 439/487; 439/70; 439/801; 439/75
(58) Field of Classification Search .......... 361/719; 439/70–71, 75, 487, 801
See application file for complete search history.

(56) References Cited

U.S. PATENT DOCUMENTS

| | | | | | |
|---|---|---|---|---|---|
| 5,288,238 | A | * | 2/1994 | Ikenaka et al. ............. | 439/91 |
| 5,330,620 | A | * | 7/1994 | Berry et al. ............... | 162/29 |
| 5,473,510 | A | * | 12/1995 | Dozier, II ................ | 361/719 |
| 5,791,914 | A | * | 8/1998 | Loranger et al. ........... | 439/71 |
| 5,833,472 | A | * | 11/1998 | Bright ..................... | 439/70 |
| 6,222,731 | B1 | * | 4/2001 | Katsui .................... | 361/697 |
| 6,223,815 | B1 | * | 5/2001 | Shibasaki ................. | 165/185 |
| 6,417,532 | B2 | * | 7/2002 | Tsunoda et al. ............ | 257/219 |
| 6,479,582 | B1 | * | 11/2002 | Hareyama et al. .......... | 524/784 |
| 6,533,589 | B1 | * | 3/2003 | Palaniappa et al. ......... | 439/71 |
| 6,903,941 | B2 | * | 6/2005 | Paola ..................... | 361/803 |
| 6,979,204 | B2 | * | 12/2005 | Gobl et al. ............... | 439/73 |

FOREIGN PATENT DOCUMENTS

| | | |
|---|---|---|
| DE | 103 16 355 | 7/2004 |
| DE | 10306643 | 8/2004 |
| DE | 102004037656 | 3/2006 |

\* cited by examiner

*Primary Examiner*—Truc T Nguyen
(74) *Attorney, Agent, or Firm*—Dicke, Billig & Czaja, PLLC

(57) ABSTRACT

A semiconductor circuit arrangement is disclosed. In one embodiment, a semiconductor module is attached to a board using a screw, with a mechanical and electrical contact being made between module contacts on the semiconductor module and associated board contacts on the board at the same time by attachment using the screw.

26 Claims, 15 Drawing Sheets

- Attachment screw 50
- Cover 60
- PCB 10
- IGBT/Mosfet/Diodes Modules with push-in contacts
- Heat sink 30

- PCB 10
- Cover 60

- Attachment screw 50
- Cover 60 with drive and protection functions A
- PCB 10
- IGBT/Mosfet/Diodes Modules 20 with push-in contacts 21
- Heat sink 30

- PCB 10
- Cover 60

- Attachment screw 50
- Cover 60 with drive and protection functions A
- PCB 10
- IGBT/Mosfet/Diodes Modules 20 with push-in contacts 21
- Heat sink 30

- PCB 10
- Cover 60

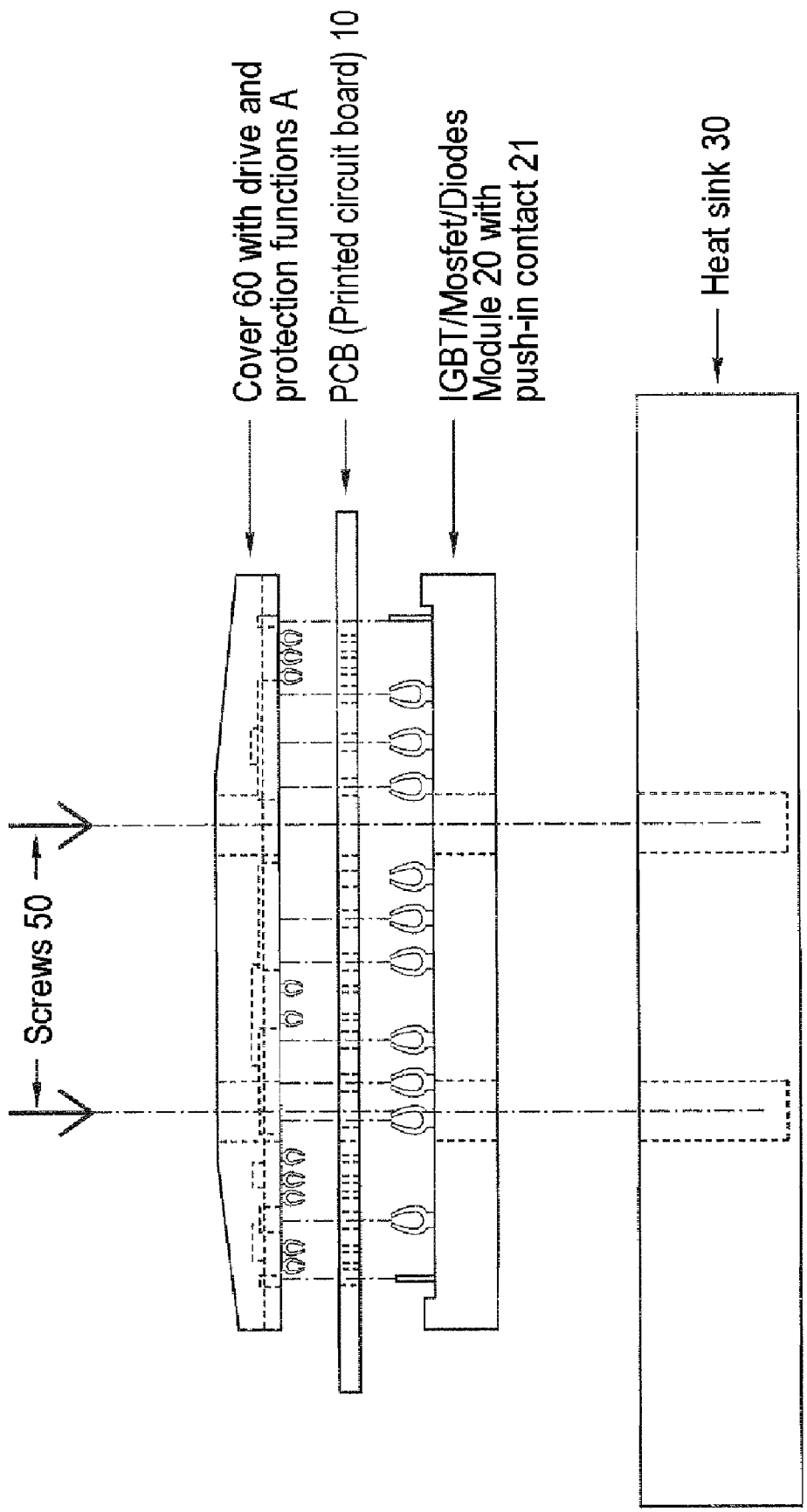

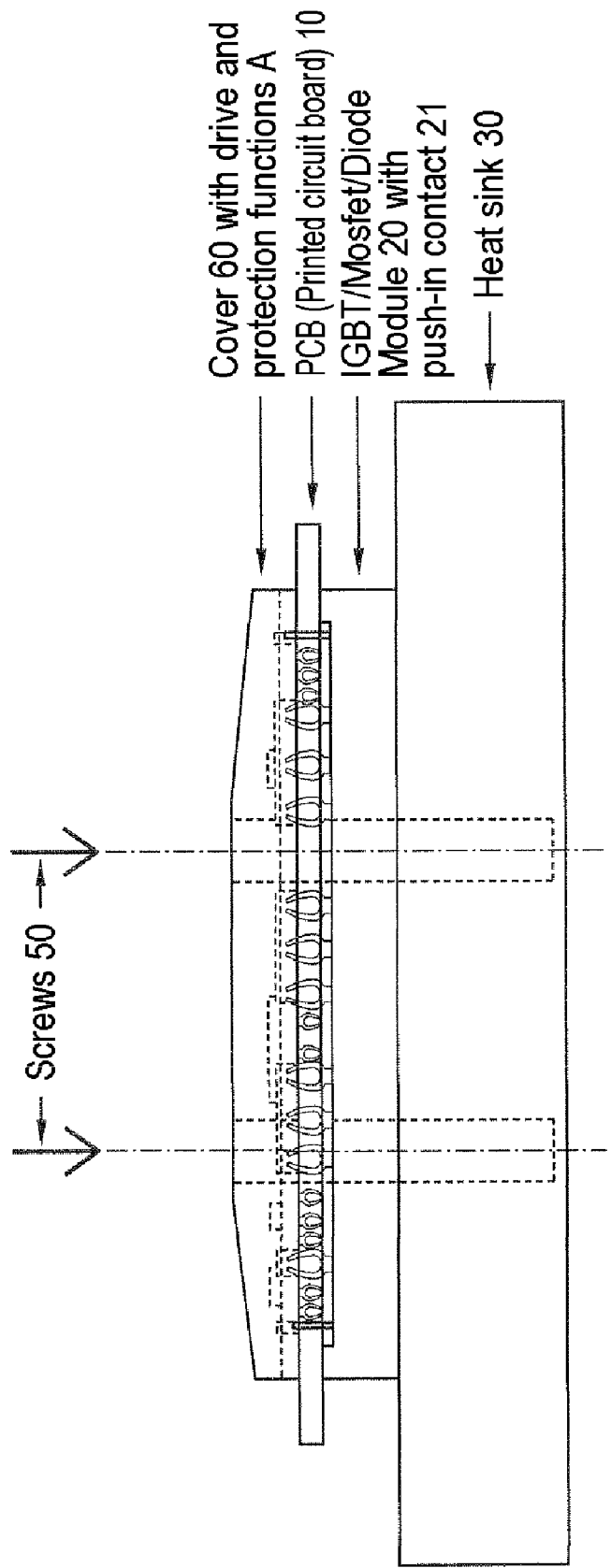

SEMICONDUCTOR CIRCUIT ARRANGEMENT

CROSS-REFERENCE TO RELATED APPLICATIONS

This Utility Patent Application claims priority to German Patent Application No. DE 10 2006 025 453.8 filed on May 31, 2006, which is incorporated herein by reference.

BACKGROUND

The present invention relates to a semiconductor circuit arrangement. One or more embodiments provide a press-fit module and a push-in power semiconductor module, for example, a push-in IGBT/MOSFET module, for simple heat sinks, and PCB mounting with or without a cover and, in particular, to corresponding modules with a drive and/or protection function integrated in a cover.

During the construction of semiconductor circuit arrangements, a multiplicity of discrete electronic components, monolithically or hybrid-integrated circuits are connected to one another and to at least one semiconductor module, in which significant power losses occur, on a mount substrate which, for example, may be referred to and may be in the form of a printed circuit board, a mount or a board, in which case the connection to a heat sink must additionally be made for the semiconductor modules.

Problems in this case include the mechanical attachment of the semiconductor modules to the substrate, and their electrical contact with and integration in the overall circuit arrangement, and, thirdly, the possible need for a thermal link to appropriate heat sinks or the like.

Until now, various work processes have been required for complete component placement and final completion of corresponding circuit arrangements, for example, a process of mounting the semiconductor module on the mount, a process of either mounting the heat sink on the board or else of attaching it to the semiconductor module itself, as well as a process of electrical connection of the modules that have been fit to the board and to the rest of the circuit provided on it.

For these and other reasons, there is a need for the present invention.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIGS. 11-18 illustrate further embodiments of the semiconductor circuit arrangement according to the invention in the form of a section side view and plan view, with a cover having control/protection electronics being provided.

DETAILED DESCRIPTION

Figure 1A:
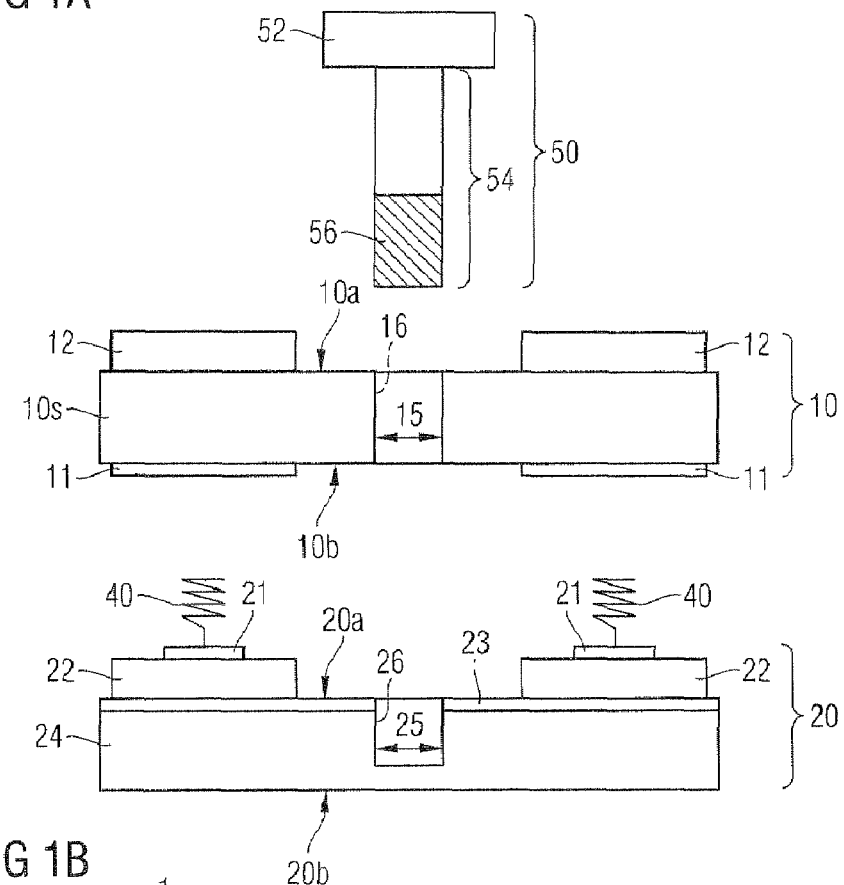
FIGS. 1A, 1B respectively illustrate a schematic and section side view and plan views of a first embodiment of the semiconductor circuit arrangement according to the invention.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

One or more embodiments provide a semiconductor circuit arrangement in which the large number of assembly processes that are required can be reduced and simplified.

In one embodiment, a semiconductor circuit arrangement provides for mounting a semiconductor module on a board by the use of a screw such that a mechanical and electrical contact are made between module contacts on the semiconductor module and respectively associated board contacts on the board at the same time during the attachment process. Furthermore, the mechanical and thermal connection to the heat sink can also be produced in the same work process. This means that there is no need for any specific intermediate work processes to respectively and individually produce mechanical, thermal and electrical links, because all of the mechanical, electrical and thermal contact problems are solved at the same time by attachment by using the screw or the screws.

In one embodiment, a semiconductor circuit arrangement is provided having a board with at least one board contact, a semiconductor module with at least one module contact and with at least one screw which is designed for attachment of the semiconductor module to the board, with each module contact being associated with one board contact and with a mechanical and electrical contact being made between the board contact and the associated module contact at the same time by attachment by using the screw.

One heat sink can be provided in order to cool at least the semiconductor module.

A mechanical and thermal contact and an attachment can be made between the semiconductor module and the heat sink by attachment by using the screw.

A module contact may be in the form of a compression spring, and an associated board contact may be in the form of a surface contact.

A module contact may be in the form of a push-in contact—in particular in the form of a spring or elastic—and an associated board contact may be in the form of a push-in recess.

In order to hold the body of the screw, the board, the semiconductor module and, possibly, the heat sink may each have an attachment hole, which are associated with one another and/or whose cross sections are aligned with one another during and for attachment.

The head of the screw may be supported on the board, in particular being recessed in its upper face or surface.

However, a cover element, a cover or an intermediate piece may also be provided between the board and the head of the screw.

In this case, the head of the screw can then be supported on the cover element, cover or intermediate piece—in particular recessed in the respective upper face or surface of it.

Control electronics for the semiconductor circuit on which the semiconductor circuit arrangement is based and/or for the semiconductor module may be provided in the cover.

The semiconductor module may have a thread, which matches the screw, in its attachment hole for the screw. In this case, the attachment hole and, possibly, the thread may be formed in the housing of the module.

The heat sink may have a thread, which matches the screw, in its attachment hole for the screw.

The board may be in the form of a DCB substrate, or may have a DCB substrate.

The board may be in the form of a PCB structure, or may have a PCB structure.

The semiconductor circuit arrangement may be in the form of a power semiconductor circuit arrangement.

The semiconductor module may be in the form of a power semiconductor module.

The semiconductor module may be formed with or from at least one element from the group which is formed from IGBTs, MOSFETs, sensors, thyristors, ICs and diodes.

The head of the screw may be supported on the upper face of the board—in particular recessed in its upper face or surface—and the upper face of the semiconductor module may be fit on the lower face of the board.

The upper face of the heat sink may be fit to the lower face of the semiconductor module.

The lower face of a cover may be fit on the upper face of the board, with the head of the screw being supported on the upper face or surface of the cover—in particular recessed in its upper face.

These and further embodiments will also become evident from the following:

the fitting of a power semiconductor module is intended to ensure, in one manufacturing process, that it is connected both to the heat sink and to the printed circuit board. A highly reliable connection technique should be used for this purpose, for example, for a PCB, which operates reliably even when subjected to a large amount of dirt. In addition, it should also be possible to transmit control signals to IPMs.

At the moment, there is no known product which solves these fundamental problems. There are two different solutions in conventional form, which either provide simple assembly in the sense of a miniskip module, or else a reliable connection technique in the sense of an econo-press-fit. The miniskip module is connected at the same time to the heat sink and to the printed circuit board in one process by using a screw connection. In this case, it uses spring contacts with the printed circuit board, which may have a high impedance in dirty and corrosive environments, that is to say the electrical contact deteriorates over time or during assembly. Furthermore these contacts cannot be used for IPM control signals because these require a certain current and voltage load in order not to become high-impedance. These contact problems are solved in an excellent manner by the use of econo modules as a solder or press-fit version. However, these econo modules require two mutually separate assembly processes, firstly the soldering or pushing-in of the module into the printed circuit board, and secondly the screwing of the module to the heat-sink element.

Embodiments of the present invention combine the strengths of the two concepts with one another, specifically by drawing in the press-fit contacts of the module with a screw in the board, with the screw at the same time attaching the module to the heat sink.

From this point of view, the essence of the invention is therefore to make the push-in process for the press-fit contacts superfluous. This process is ensured by using a screw connection, which is required in any case, in order to attach the module to the heat sink. One production process is therefore saved. Furthermore, these and further aspects of the present invention will also become evident from the further comments which are outlined in the following text:

One or more embodiments provide a semiconductor circuit arrangement design which allows an assembly process in as simple a form as possible in a single work process, such that a) attachment to the PCB, b) attachment to the heat sink and c) electrical connection for example, between the PCB and module—for example, a module with or including IGBTs, MOSFETs, sensors, thyristors, ICs and diodes—are created at the same time during the assembly process.

Until now, electrical connections have been made by soldering, by screws and by spring contacts. The module—for example, a module with or including IGBTs, MOSFETs, sensors, thyristors, ICs and diodes—was screwed to the heat sink as an additional work step.

This uses greater manufacturing efforts.

In the present embodiments, the module makes contact with the PCB by using a push-in contact and attaches the PCB structure and the module—for example, a module with or including IGBTs, MOSFETs, sensors, thyristors, ICs and diodes—to the heat sink in the same process.

In addition, driver electronics can also be integrated in a cover that is provided.

The pressing of a module—for example, a module with or including IGBTs, MOSFETs, sensors, thyristors, ICs and diodes—into a PCB structure with mechanical attachment of the PCB structure at the same time and, furthermore, with the module being mounted on the cooling medium at the same time, is therefore a fundamental idea of one aspect of the present invention.

These and further embodiments will also be illustrated, using different words, on the basis of the following explanations:

at the moment, the development of power electronics in the power range from 1 to 50 kW is characterized by two aspects or trends, which could drastically change the design of power-electronic appliances in the long term:

the desire to use solder-free assembly techniques for the power semiconductor module.

For some users, there is no longer any need for soldering of wire-based power semiconductor modules using wave-soldering installations, selective soldering installations or manual workstations, because of the increasing miniaturization of signal-processing components in power electronics, the conversion to lead-free soldering and the efforts to reduce the number of processes involved in the manufacture of power-electronic appliances. The manufacturers of power semiconductor modules have reacted to this demand by the introduction of modules for solder-free assembly techniques or by development of modules which can be processed using the reflow soldering process. Solutions in which the electrical connection for the printed circuit board and the thermal link to the heat sink can be produced in the same process are regarded as particularly advantageous.

Integration of drive and protection functions as well as galvanic isolation of the drive signals in the power semiconductor module, which in consequence becomes an intelligent power module (IPM).

Power semiconductor modules which contain drive and protection functions have been commercially available for about 15 years. In this case contact is made for the control signals using a wire-based connection technique, or via plugs. The additional integration of the galvanic isolation of the drive signals is likewise achieved individually. IPM modules such as these have been able to obtain considerable market shares in regionally confined markets and for specific applications, and it can be expected that there will be an interest in IPMs in the long term additionally in markets which until now have been dominated by traditional power semiconductor modules, once it is possible to integrate a functional scope that is appropriate for the customer expectations.

At the moment, no products are known which are appropriate for both aspects and trends and thus allow direct and solder-free connection to the application-side printed circuit board.

Users who would like to use an IPM and do not wish to use a soldering process for the IPM can at the moment use only IPMs in which the control connections are connected to the printed circuit board of the appliance via cables provided with plug connections and the power connections are connected to the printed circuit board of the appliance via screw contacts. Connection techniques such as these involve a large number of parts, and a high degree of manufacturing and test effort.

Solder-free connection techniques require not only the power semiconductor module itself but also accessories. In technologies in which the thermal connection of a heat sink is produced in the same step, these parts remain in the system after assembly. In order to maintain the electrical and thermal connection, a force is permanently introduced into the power semiconductor module via this accessory, or it is used permanently to introduce force to the thermal connection and at times (during assembly) to introduce the pushing-in force for the electrical connection. Since these accessories remain in the system, unlike the tool in the case of traditional push-in assembly, for example, electrical functions may be integrated in these parts. The electrical connections between the accessory, the printed circuit board or the power semiconductor module may be produced using the same solder-free connection techniques as the connection between the printed circuit board and the power module, that is to say a spring contact or push-in contact. The power semiconductor module and drive and protection functions which are integrated in the accessory thus become part of the IPM after assembly. The electronics for the drive and protection functions can be accommodated in a space which, in terms of thermal and EMC aspects, offers better conditions than integration directly in the power module. The electronics for drive and protection functions occupy little (costly) space on the DCB (single-layer approach). The electronics for drive and protection functions do not increase the physical height of the power semiconductor module, and thus the distance between the printed circuit board and the heat sink (two-layer approach). The housing of the power semiconductor module, the printed circuit board and the housing function of the accessory provide good protection for the drive and protection electronics against any plasma which may occur in the power semiconductor module in the event of a fault. This also makes it possible to integrate galvanic isolation in the drive circuit in order to comply with the requirements for safe electrical isolation.

Another aspect of the invention is therefore to use an accessory, which is used for solder-free fitting of a power module in the application circuit and on the heat sink, and which may in the following text also be referred to as a cover, at the same time as a housing for integration of the drive and protection functions, and thus to complement the power semiconductor module to form an IPM.

FURTHER SPECIFIC EXEMPLARY EMBODIMENTS

Figure 11:
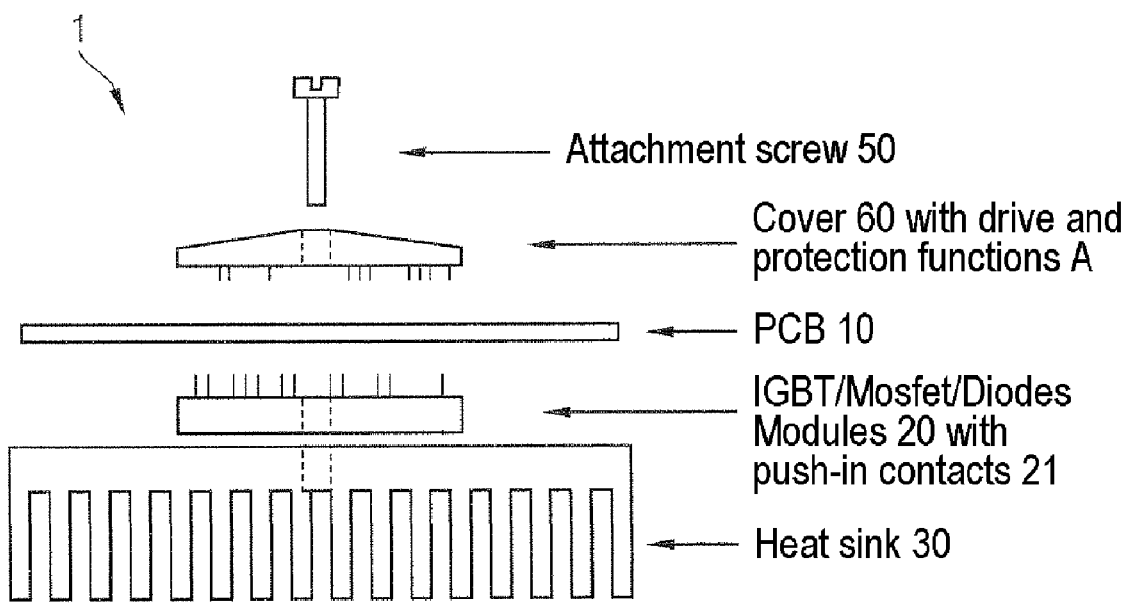
Figure 14:
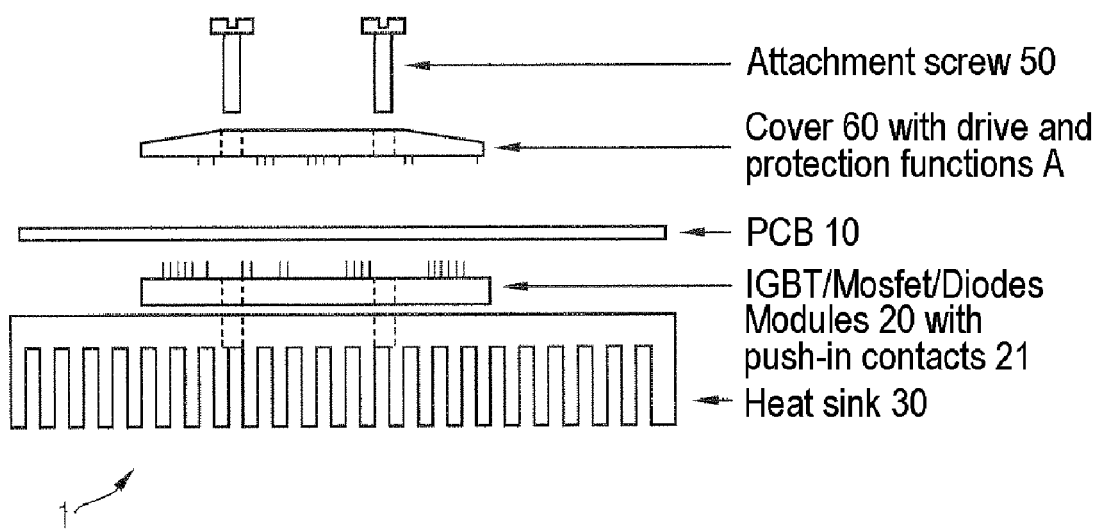

The following options also exist, among others, for the physical integration of the overall arrangement:

the power modules and cover are connected via one central screw both to one another and to the heat sink and to the customer-end printed circuit board (FIG. 11).

the power module and cover are connected to one another via a plurality of screws (FIG. 14).

The number and arrangement of the screws are in this case chosen such that, on the one hand, a sufficiently high force for good thermal contact is applied over the entire area between the module and the heat sink and, at the same time, it is possible to apply the forces that are required to push in the pin or to push on the spring contacts, without the bending forces that occur in the cover becoming excessive.

With regard to the design of the power modules, it is possible to use modules with a base plate as well as modules without a base plate.

Both push-in contacts and spring contacts may be used for the contacts between the power module and the printed circuit board (PCB).

The connection between the cover and the printed circuit board is made by using push-in contacts. Spring contacts can likewise be used, provided that attention is paid to the specific requirements for reliability of such spring contacts, which are loaded only with low currents, by the physical design and choice of the surface.

Possible typical drive and protection functions which can be integrated in the cover are as follows:

drivers with/without galvanic isolation,
circuits for temperature monitoring, and
circuits for current measurement.

Figure 12:
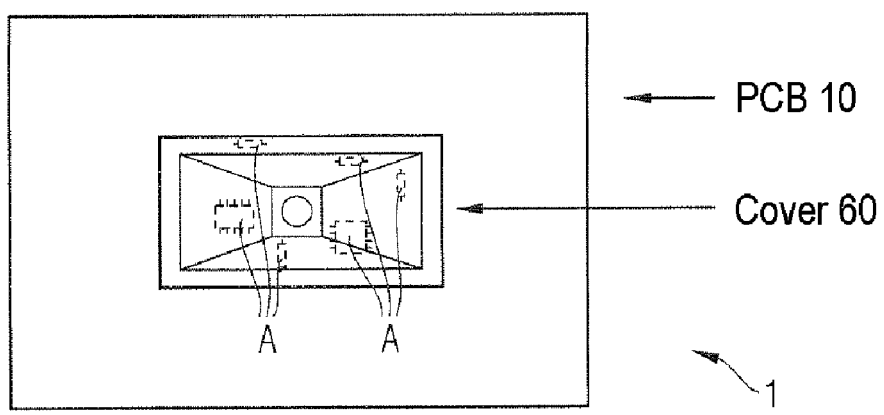
Figure 13:
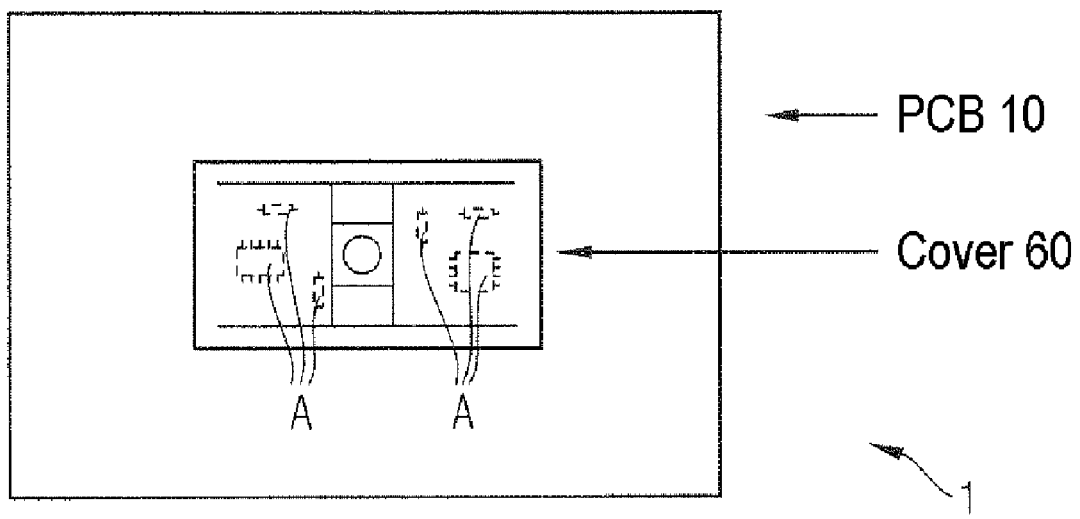
Figure 15:
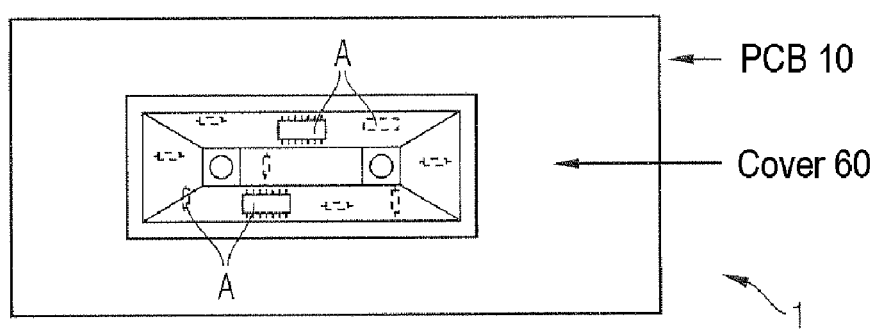
Figure 16:
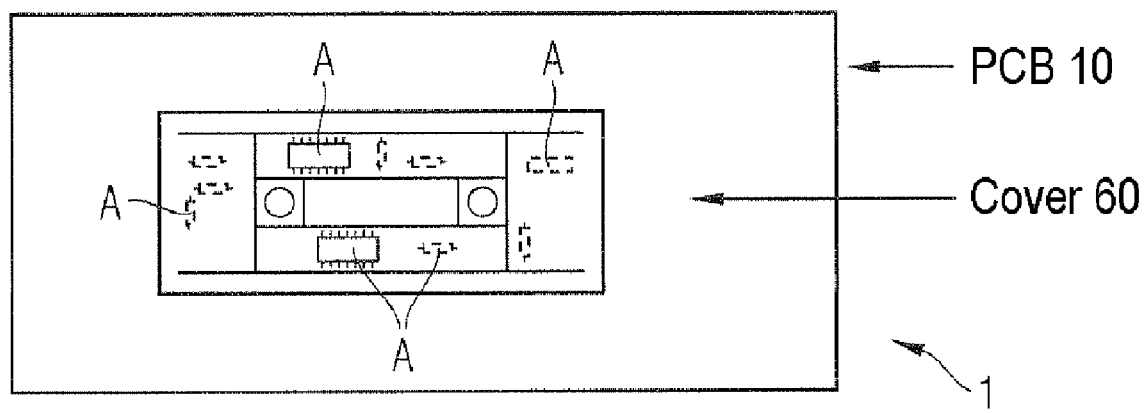

The following further embodiments may be used for the cover, in order in this way to make it possible to provide the mechanical and electrical functions at the same time:

drive and protection electronics on the printed circuit board, the plastic injection-molded part for force introduction (FIG. 13, FIG. 16), possibly reinforced by inserted metal parts.

drive and protection electronics on a printed circuit board, extrusion-coated with a molding component (FIG. 12, FIG. 15).

drive and protection electronics formed on a 3D-MID (molded interconnect device).

The same reference symbols are used in the following text for structural and/or functionally similar or comparable elements. The individual elements are not described in detail repeatedly whenever they occur.

The following text first of all refers generally to the figures:

According to one or more embodiments, a semiconductor circuit arrangement 1 is provided having a board 10 with at least one board contact 11, a semiconductor module 20 with at least one module contact 21, and at least one screw 50 which is designed for attachment of the semiconductor module 20 to the board 10. Each module contact 21 is associated with one board contact 11, and with a mechanical and electrical contact being made between the board contact 11 and the associated module contact 21 at the same time by attachment by using the screw 50.

A heat sink 30 may be provided in order to cool at least the semiconductor module 20.

A mechanical and thermal contact and an attachment between the semiconductor module 20 and the heat sink 30 can be formed by attachment by using the screw 50.

A module contact 21 may be in the form of a compression spring, and an associated board contact 11 may be in the form of a surface contact.

A module contact 21 may in the form of an—in particular spring-like or elastic—push-in contact, and an associated board contact 11 may be in the form of a push-in recess. The push-in recess may be provided in the form of a socket or coupling.

In order to hold the body 54 of the screw 50, the board 10, the semiconductor module 20 and, possibly, the heat sink 30 may each have an attachment hole 15, 25, 35, respectively, which holes are associated with one another and whose cross sections are aligned with one another during and for attachment.

The head 52 of the screw 50 may be supported on the board 10.

A cover element 60, a cover or an intermediate piece or pieces may be provided between the board 10 and the head 52 of the screw 50.

In this case, the head 52 of the screw 50 may be supported on the cover element 60, the cover 60 or the intermediate piece 60—in particular recessed in the respective upper face 60a or surface 60a.

Control electronics for the semiconductor circuit on which the semiconductor circuit arrangement 1 is based and/or for the semiconductor module 20 may be provided in the cover 60.

In its attachment hole 25 for the screw 50, the semiconductor module 20 may have a thread 26, which matches the screw 50 and its thread 56.

In its attachment hole 35 for the screw 50, the heat sink 30 may have a thread 36, which matches the screw 50 and its thread 56.

The board 10 may be in the form of a DCB substrate, or may have a DCB substrate.

The board 10 may be in the form of a PCB structure, or may have a PCB structure.

The semiconductor circuit arrangement 1 may be in the form of a power semiconductor circuit arrangement.

The semiconductor module 20 may be in the form of a power semiconductor module.

The semiconductor module 20 may be formed with or from at least one element from the group which is formed from IGBTs, MOSFETs and diodes.

The head 52 of the screw 50 may be supported on the upper face 10a or surface 10a of the board 10—in particular recessed in its upper face 10a or surface 10a—and the upper face 20a of the semiconductor module 20 may be fit on the lower face 10b of the board 10.

The upper face 30a of the heat sink 30 may be fit to the lower face 20b of the semiconductor module 20.

Figure 1B:
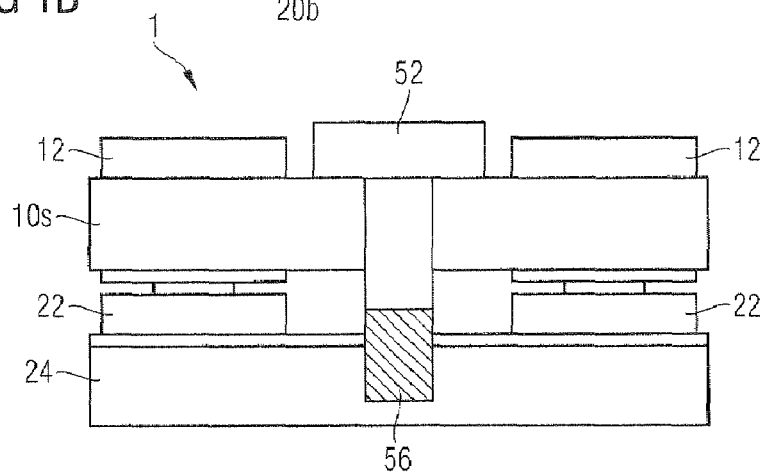

The lower face 60b of a cover 60 may be fit on the upper face 10a of the board 10, with the head 52 of the screw 50 being supported on the upper face 60a or surface 60a of the cover 60—in particular recessed in its upper face 60a or surface 60a. FIGS. 1A, 1B illustrate schematic and section side views of a first embodiment of the semiconductor circuit arrangement 1.

This semiconductor circuit arrangement 1 is based on a board 10 which is formed from an actual board substrate 10s and has an upper face 10a or surface 10a and a rear face 10b or lower face 10b, with components 12 being fit on the upper face 10a, and with board contacts 11 being formed on the lower face 10b.

Furthermore, in this embodiment, a semiconductor module 20 is provided with an upper face 20a and a lower face 20b. This semiconductor module 20 includes a mount 24, which has semiconductor circuits, in the form of chips 22, over an attachment layer 23 in the area of the surface 20a. Module contacts 21 are provided thereon, and in this embodiment are or have spring elements 40.

In the arrangement illustrated in FIG. 1A, the board 10 and the semiconductor module 20 have not yet been assembled by using the screw 50, and are physically separate from one another.

In the arrangement illustrated in FIG. 1B, in contrast, the additionally provided screw 50 has been introduced as an attachment mechanism with the screw body 54 into the attachment holes 15 and 25, respectively, provided in the board and in the module, so that the screw head 52 is supported on the surface 10a of the board 10. The force that acts and thus the contact between the module contacts 21 and the board contacts 11 are produced by the engagement of the thread 56 on the screw body 54 with the thread 26 in the attachment hole 25 of the semiconductor module 20 in its housing.

The procedure as described in FIGS. 1A and 1B results in mechanical, electrical and thermal contacts being produced between the board 10 and the semiconductor module 20 in a single attachment step, specifically the formation of the screw connection by using the attachment screw 50.

The arrangement in FIGS. 1A, 1B represents the simplest form of the concept according to the invention, because in this case the attachment screw 50 is supported directly by its head 52 in the surface 10a of the board 10 and, on the other hand, the thread 56 is screwed directly in the body or housing 24 of the module 20.

An opposite arrangement is also feasible, in which the board 10 has a thread 16 and the head 52 of the screw 50 is supported on the lower face 20b, possibly recessed in the lower face 20b, of the module 20.

FIGS. 1A, 1B are schematic and section side views of a first embodiment of the semiconductor circuit arrangement 1 according to the invention.

This semiconductor circuit arrangement 1 is based on a board 10 which is formed by an actual board substrate 10s and has an upper face 10a or surface 10 and a rear face 10b or lower face 10b, with components 12 being fit on the upper face 10a, and with board contacts 11 being formed on the lower face 10b.

Furthermore, in this embodiment, a semiconductor module 20 is provided having an upper face 20a and a lower face 20b. This semiconductor module 20 includes a mount 24, which has semiconductor circuits in the form of chips 22 over an attachment layer 23 in the area of the surface 20a. Module contacts 21 are provided thereon and in this embodiment are or have spring elements 40.

In the arrangement in FIG. 1A, the board 10 and the semiconductor module 20 have not yet been assembled by using the screw 50, and are physically separate from one another.

In the arrangement illustrated in FIG. 1B, in contrast, the additionally provided screw 50 has been introduced as an attachment means with the screw body 54 into the attachment holes 15 and 25, respectively, provided in the board and in the module, so that the screw head 52 is supported on the surface 10a of the board 10. The force that acts and thus the contact between the module contacts 21 and the board contacts 11 are produced by the engagement of the thread 56 on the screw body 54 with the thread 26 in the attachment hole 25 of the semiconductor module 20 in its housing.

The procedure as described in FIGS. 1A and 1B results in mechanical, electrical and thermal contacts being produced between the board 10 and the semiconductor module 20 in a single attachment step, specifically the formation of the screw connection by using the attachment screw 50.

In FIG. 2, the attachment hole 25 is formed in the module 20 without a thread 26 by the procedure in Figure Elements 2A and 2B, but with the lower face 20b of the module 20 being located opposite a heat sink 30 with an upper face 30a and a lower face 30b, and in an attachment hole 35 with a thread 36 which matches the thread 56 on the screw 50.

Figure 2A:
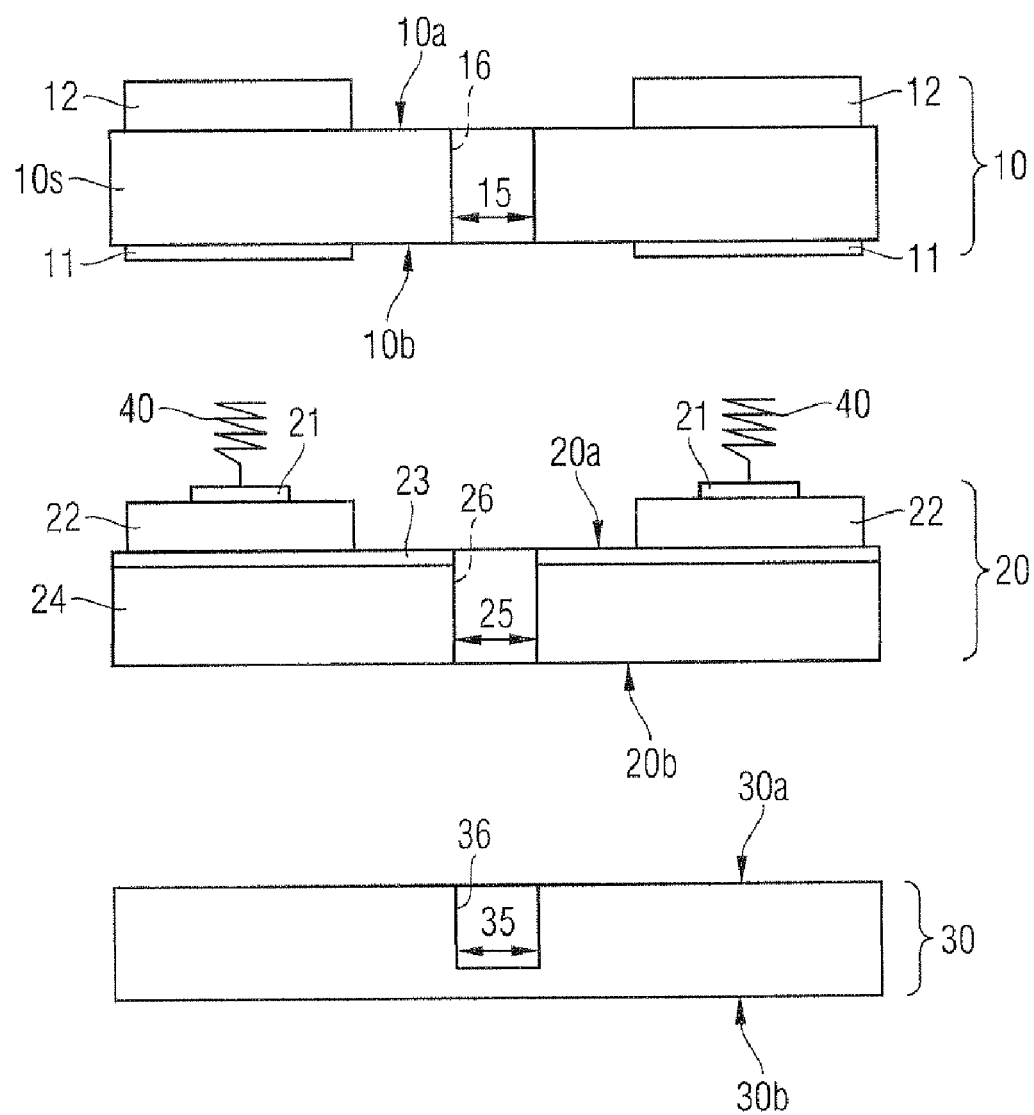
FIGS. 2A, 2B respectively illustrate a schematic and section side view and plan views of a further embodiment of the semiconductor circuit arrangement according to the invention.

In the arrangement illustrated in FIG. 2A, the board 10, the semiconductor module 20 and the heat sink 30 have not yet been screwed to one another via the screw 50, but are provided separately. In the arrangement illustrated in FIG. 2B, in contrast, the attachment holes 15, 25 and 35 are arranged such that their cross sections match or are aligned and the screw 50 has been inserted as attachment means, thus forming mechanical retention and mechanical, electrical and thermal contacts between the board 10, the semiconductor module 20 and the heat sink 30.

Figure 2B:
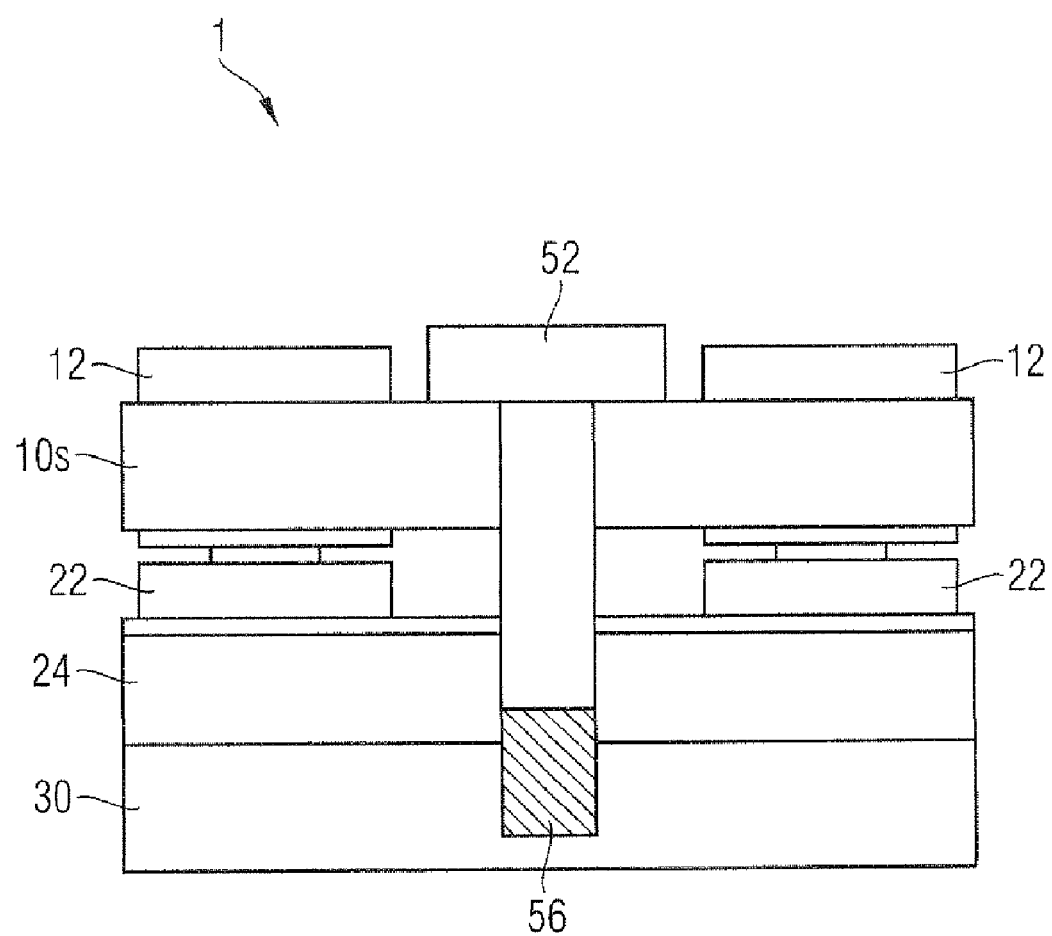

The arrangement in FIGS. 2A, 2B represents the simplest form of the concept, because the attachment screw 50 is in this case supported directly by its head 52 in the surface 10a of the board 10 and, on the other hand, the thread 56 is screwed directly into the thread 36 on the heat sink 30.

An opposite arrangement is also feasible, in which the board 10 has a thread 16 and the head 52 of the screw 50 is supported on the lower face 30b, possibly recessed in the lower face 30b, of the heat sink 30.

Figure 3:
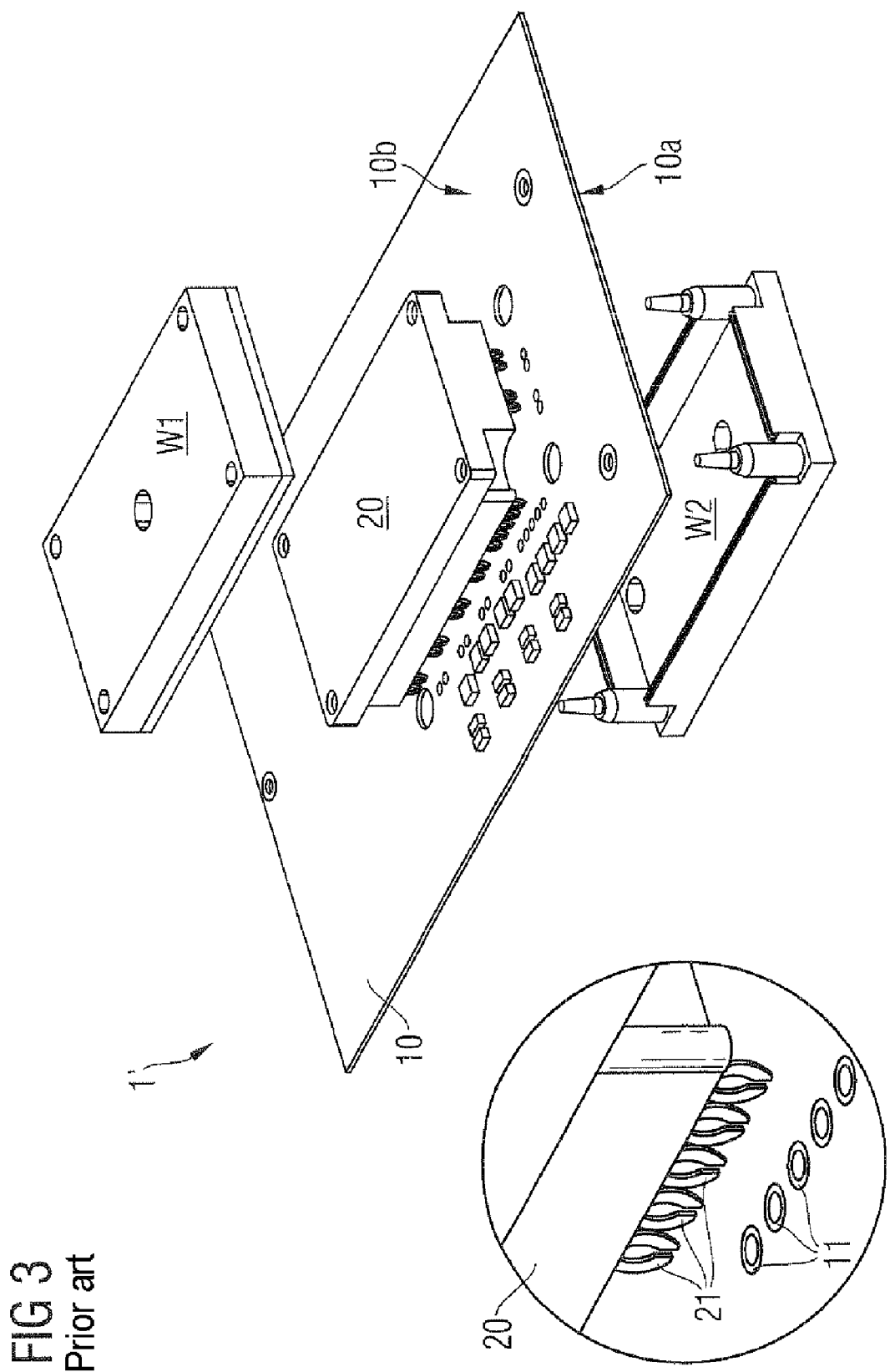
FIG. 3 illustrates a perspective and quasi-photographic illustration of the conventional arrangement of a semiconductor module on a board during a conventional assembly process.

In the arrangement in FIG. 3, which illustrates a perspective plan view of one embodiment of a conventional semiconductor circuit arrangement 1', the module 20 is provided with its upper face 20a on the rear face of the board 10. Attachment and contact are provided by plug-in contacts, formed by corresponding board and module contacts 21 and 11, respectively. The assembly process is carried out by using first and second contact-pressure tools W1 and W2, from the front face 10a and from the rear face 10b of the board, respectively.

FIG. 3 illustrates an enlarged illustration of the module contacts 21, which are referred to as spring, snap-action or press-fit contacts, and their associated mating contacts 11 on the rear face 10b of the board 10, specifically in the form of sockets, sleeves or recesses.

Figure 4:
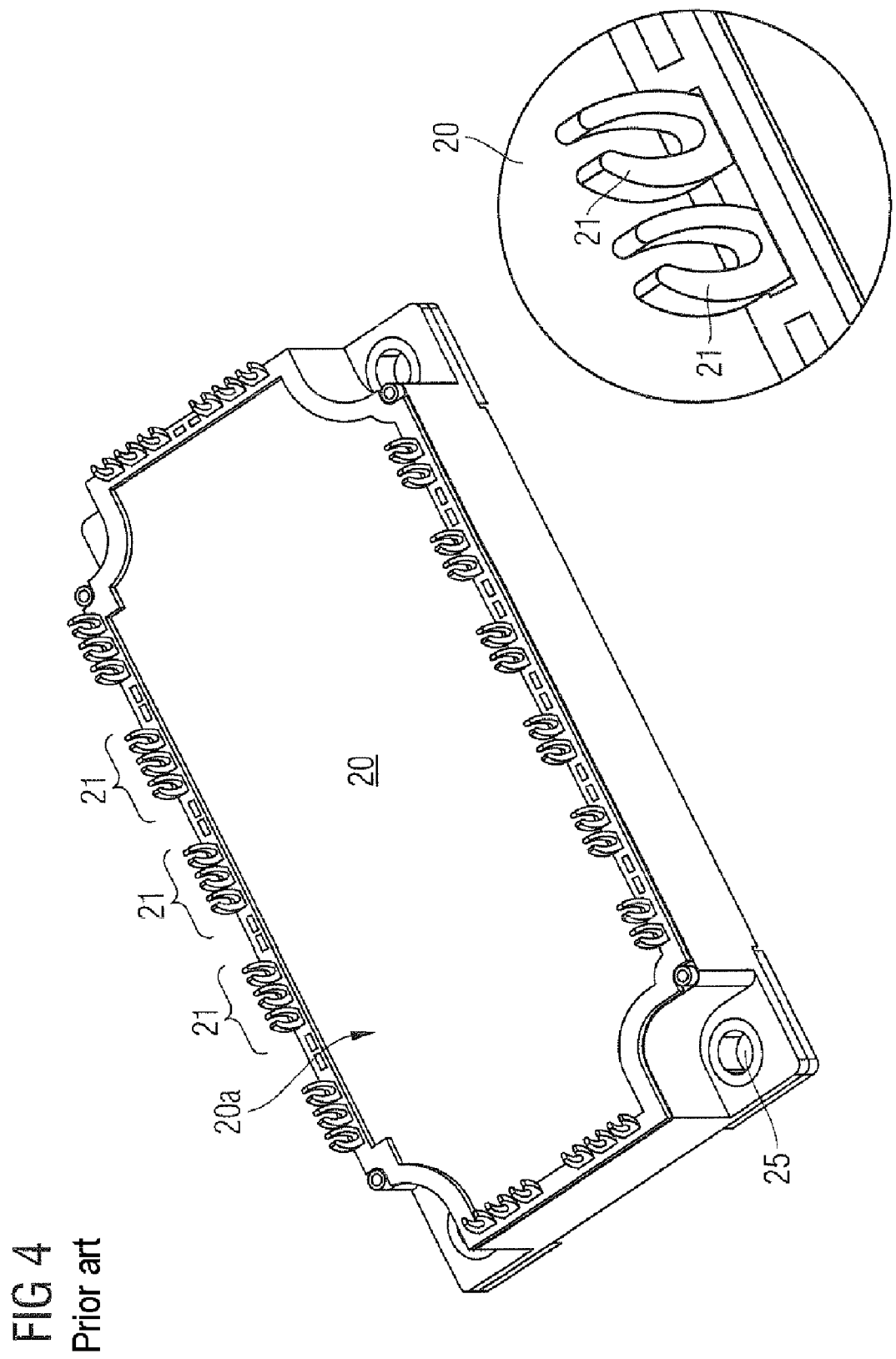
FIG. 4 illustrates a perspective plan view, like a photograph, of the upper face of the semiconductor module in FIG. 3, with corresponding push-in contacts, in detail.

FIG. 4 illustrates an enlarged illustration of the upper face 20a of the module 20 with the module contacts 21 in the form of spring, snap-action or push-in contacts.

Figure 5:
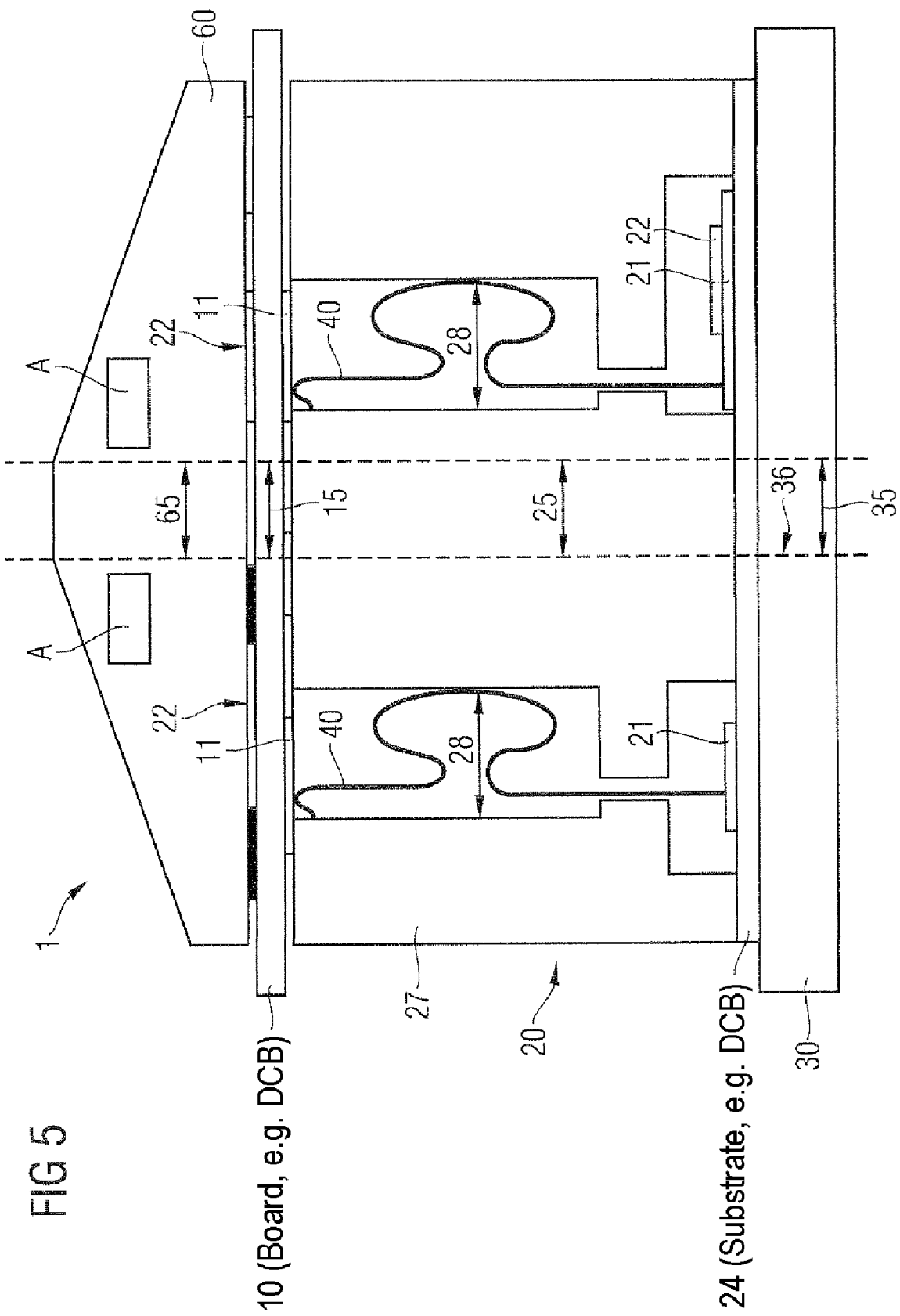
FIG. 5 illustrates a schematic and section side view of one embodiment of the semiconductor circuit arrangement according to the invention.

FIG. 5 illustrates a schematic and section side view of a further embodiment of the semiconductor circuit arrangement 1.

This semiconductor circuit arrangement 1 is once again based on a board 10 which is formed by an actual board substrate 10s and has an upper face 10a or surface 10a and a rear face 10b or lower face 10b, with components 12 being fit on the upper face 10a, and with board contacts 11 being formed on the lower face 10b.

Furthermore, in this embodiment, a semiconductor module 20 is provided having an upper face 20a and a lower face 20b. This semiconductor module 20 includes a mount 24, which has semiconductor circuits in the form of chips 22 over an attachment layer in the area of the surface 20a. Module contacts 21 are provided thereon and in this embodiment have spring elements 40 in recesses 28 in the module housing 27.

The upper face 30a of a heat sink is fit on the rear face 20b of the module 20. The lower face 10b of the board 10 and the board contacts 11 are adjacent to the upper face 20a of the module 20. The lower face 60b of the cover 60 is supported on the upper face 10a of the board 10. As in this embodiment, the cover may have a drive and/or protection function A in the form of corresponding drive and/or protection electronics, or a corresponding drive and/or protection circuit A, or a part of it.

The cover 60, the board 10, the module 20 and the heat sink 30 have respective attachment holes 65, 15, 25 and 35, which are covered when finally assembled. The use of screw connection by using the screw 50, which is not illustrated here, for assembly results in the arrangement illustrated here, in which the spring contacts 40 make a mechanical and electrical contact between the module contacts 21 and the board contacts 11, with a mechanical and a thermal contact also being produced between the module 20 and the heat sink 30.

FIGS. 6 and 7 and 8 and 9 respectively illustrate a schematic and section side view and plan view of arrangements 1 according to the invention with a cover 60, a board 10, a module 20 and a heat sink 30, to be precise with one or two screws 50. In this case, the heat sinks 30 have the mating thread 36 for the threads 56 on the screws 50 in the attachment holes 35. The heads 52 of the screws 50 are supported on the upper faces 60a of the cover 60.

Figure 6:
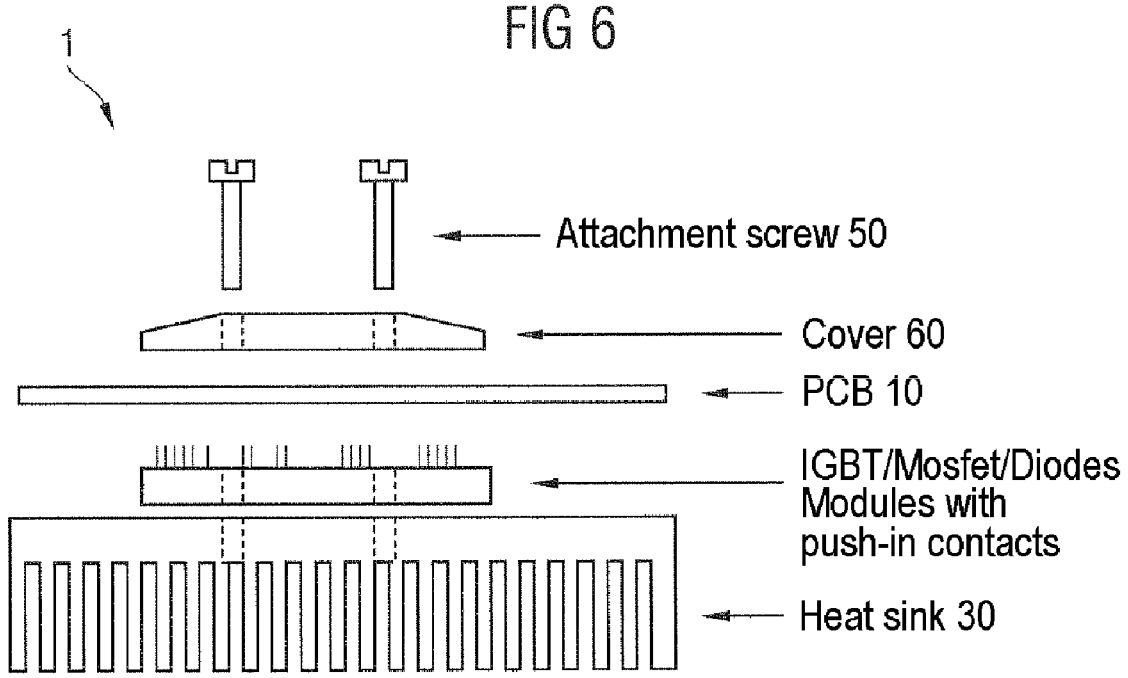
FIGS. 6-10 illustrate further embodiments of the semiconductor circuit arrangement according to the invention in the form of a section side view and plan view.
Figure 7:
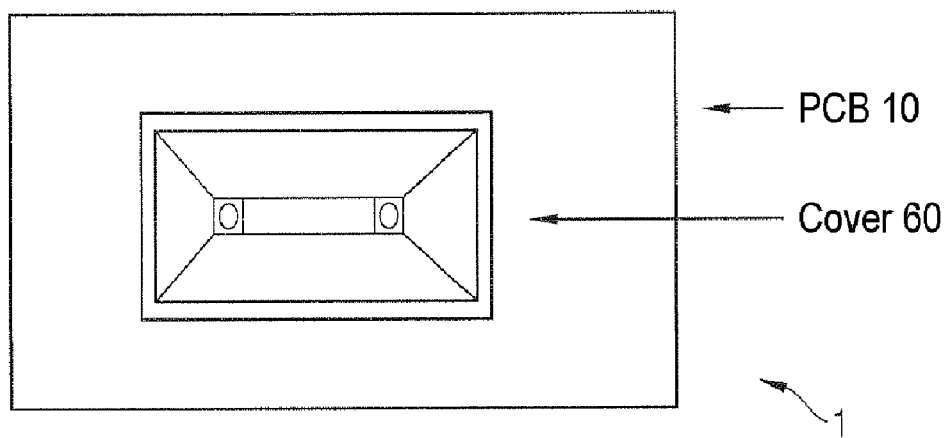
Figure 8:
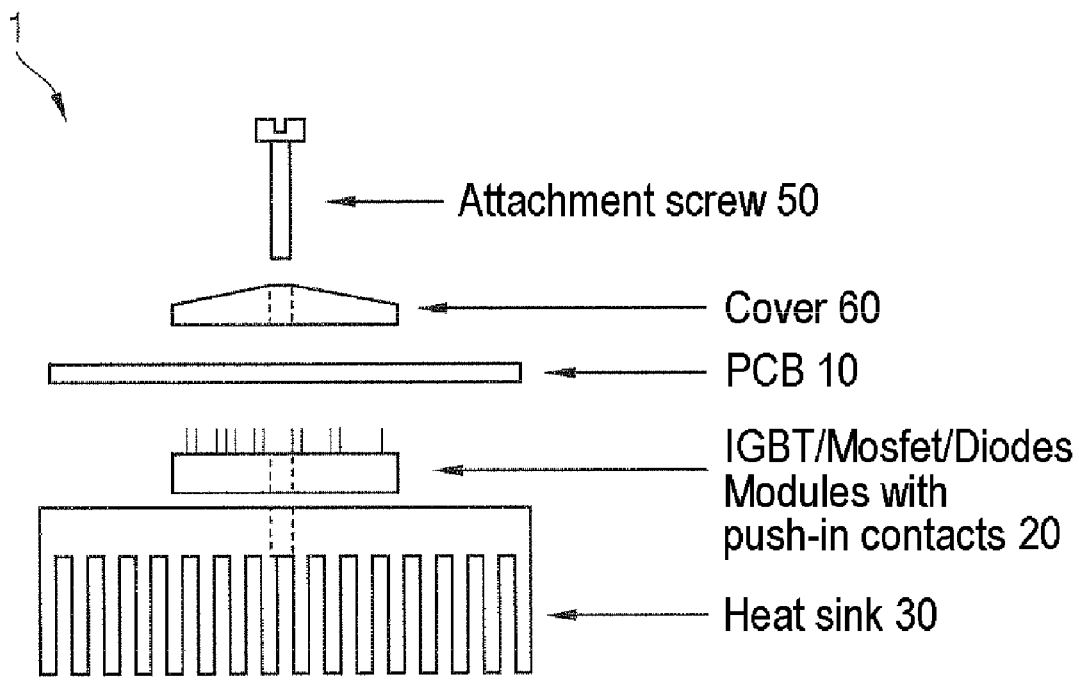
Figure 9:
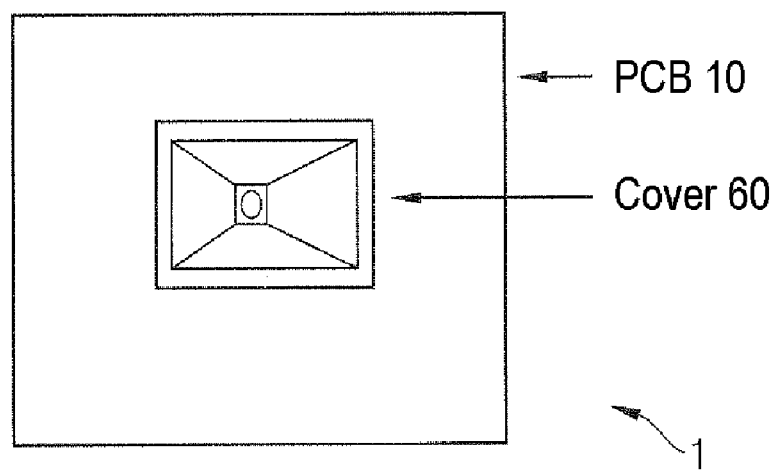
Figure 10:
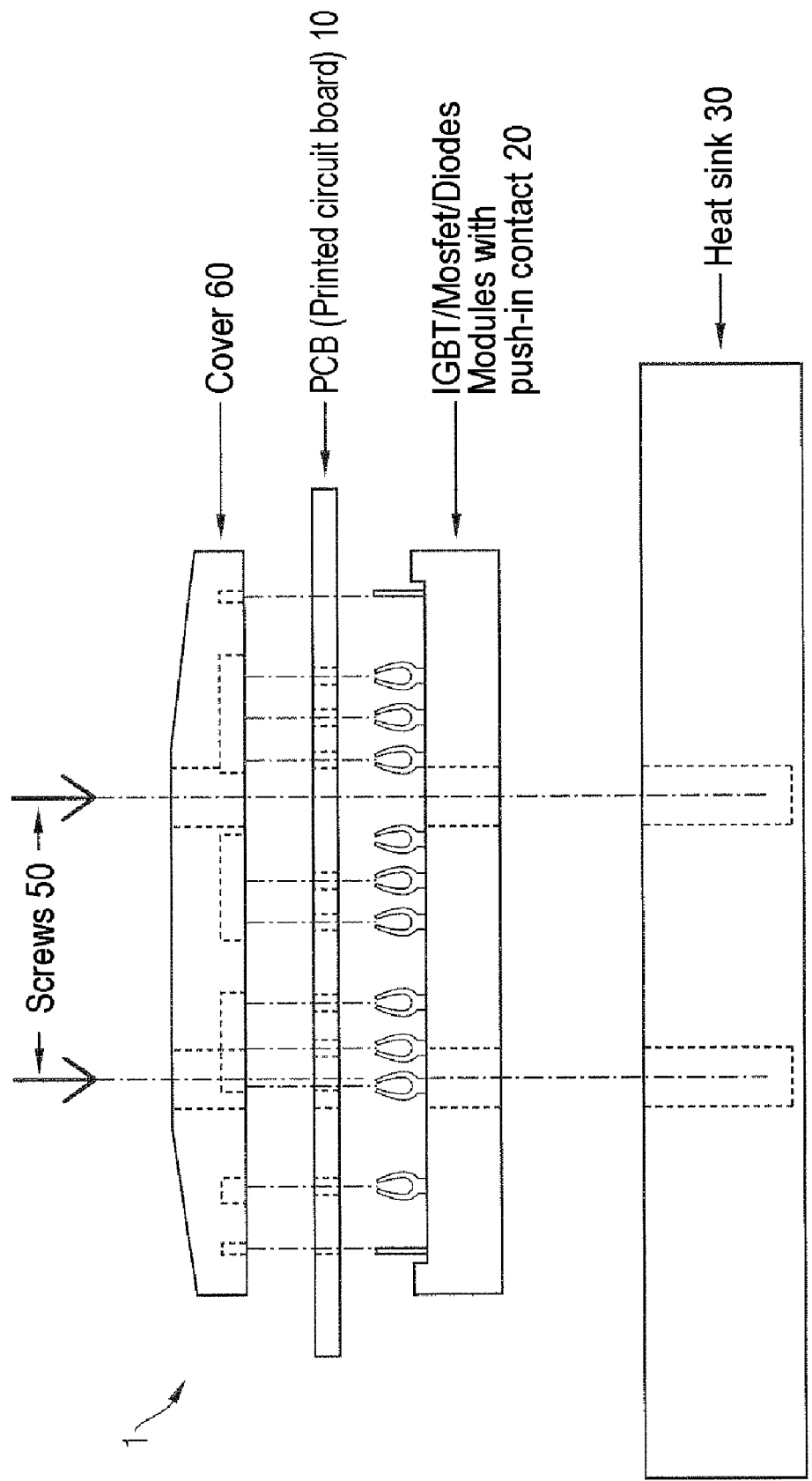

FIG. 10 illustrates a schematic and section side view of an arrangement 1 according to the invention, analogous to FIG. 6, with spring-like push-in contacts as or for module contacts 21.

FIGS. 11 to 18 illustrate further embodiments of the semiconductor circuit arrangement, in the form of a section side view and plan view, respectively, with a cover with control/protection electronics A being provided.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor circuit arrangement, comprising:
    a board with at least one board contact;
    a semiconductor module with at least one module contact, with each module contact being associated with one board contact;
    at least one screw configured for attachment of the semiconductor module to the board;
    a heat sink configured to cool at least the semiconductor module; and
    with a mechanical and electrical contact being made between the board contact and the associated module contact, and with a mechanical and thermal contact and an attachment being made between the semiconductor module and the heat sink, at the same time by attachment by using the screw, wherein at least one module contact is in the form of a spring-like, elastic and/or plastic push-in contact, and an associated board contact is in the form of a push-in recess.

2. The semiconductor circuit arrangement of claim 1, wherein a head of the screw is supported on the board, recessed in an upper face of the board.

3. The semiconductor circuit arrangement of claim 1, comprising:
a cover element provided between the board and the head of the screw; and
where the head of the screw is supported on the cover element, recessed in an upper face.

4. The semiconductor circuit arrangement of claim 3, comprising wherein control electronics and/or protection electronics for the semiconductor circuit on which the semiconductor circuit arrangement is based and/or for the semiconductor module are provided in the cover element.

5. A semiconductor circuit arrangement comprising:
a board with at least one board contact;
a semiconductor module with at least one module contact;
at least one screw configured for attachment of the semiconductor module to the board;
with each module contact being associated with one board contact;
with a heat sink being provided to cool at least the semiconductor module;
with a mechanical and electrical contact being made between the board contact and the associated module contact on the one hand, and with a mechanical and thermal contact and an attachment being made between the semiconductor module and the heat sink, on the other hand, at the same time by attachment by using the screw;
with a cover element being provided between the board and the head of the screw;
with the head of the screw being supported on the cover element—in particular recessed in its upper face; and
with control electronics and/or protection electronics for the semiconductor circuit on which the semiconductor circuit arrangement is based and/or for the semiconductor module being provided in the cover element,
wherein at least one module contact comprises a spring-like, elastic and/or plastic push-in contact, and an associated board contact comprises a push-in recess.

6. The semiconductor circuit arrangement of claim 5, comprising wherein, in order to hold the body of the screw, the board, the semiconductor module, possibly the cover element and the heat sink each have an attachment hole, respectively, which are associated with one another and whose cross sections are aligned with one another during and for attachment.

7. The semiconductor circuit arrangement of claim 5, comprising wherein the semiconductor module has a thread, which matches the screw, in its attachment hole for the screw.

8. The semiconductor circuit arrangement of claim 5, comprising wherein the heat sink has a thread, which matches the screw, in its attachment hole for the screw.

9. The semiconductor circuit arrangement of claim 5, comprising wherein the board has a DCB substrate.

10. The semiconductor circuit arrangement of claim 5, comprising wherein the board has a PCB structure.

11. The semiconductor circuit arrangement of claim 5, comprising wherein the semiconductor circuit arrangement is configured as a power semiconductor circuit arrangement.

12. The semiconductor circuit arrangement of claim 5, comprising wherein the semiconductor module is a power semiconductor module.

13. The semiconductor circuit arrangement of claim 5, comprising wherein the semiconductor module is formed with or from at least one element from the group which is formed from IGBTs, MOSFETs, thyristors, ICs and diodes.

14. The semiconductor circuit arrangement of claim 5, comprising wherein a head of the screw is supported on the upper face of the board, recessed in an upper face, and an upper face of the semiconductor module is fit on a lower face of the board.

15. The semiconductor circuit arrangement of claim 5, comprising wherein an upper face of the heat sink is fit to a lower face of the semiconductor module.

16. The semiconductor circuit arrangement of claim 5, comprising wherein a lower face of a cover element is fit on an upper face of the board, with the head of the screw being supported on the upper face of the cover element.

17. A semiconductor circuit arrangement comprising:
a board with at least one board contact;
a semiconductor module with at least one module contact;
at least one screw configured for attachment of the semiconductor module to the board;
with each module contact being associated with one board contact;
with a heat sink being provided to cool at least the semiconductor module;
with a mechanical and electrical contact being made between the board contact and the associated module contact on the one hand, and with a mechanical and thermal contact and an attachment being made between the semiconductor module and the heat sink, on the other hand, at the same time by attachment by using the screw;
with a cover element being provided between the board and the head of the screw;
with the head of the screw being supported on the cover element—in particular recessed in its upper face; and
with control electronics and/or protection electronics for the semiconductor circuit on which the semiconductor circuit arrangement is based and/or for the semiconductor module being provided in the cover element,
wherein a module contact comprises a compression spring, and as associated board contact is in the form of a surface contact, and
wherein the semiconductor module has a thread, which matches the screw, in its attachment hole for the screw.

18. A semiconductor circuit arrangement comprising:
a board with at least one board contact;
a semiconductor module with at least one module contact;
at least one screw configured for attachment of the semiconductor module to the board;
with each module contact being associated with one board contact;
with a heat sink being provided to cool at least the semiconductor module;
with a mechanical and electrical contact being made between the board contact and the associated module contact on the one hand, and with a mechanical and thermal contact and an attachment being made between the semiconductor module and the heat sink, on the other hand, at the same time by using the screw;
with a cover element being provided between the board and the head of the screw;
with the head of the screw being supported on the cover element in particular recessed in its upper face; and with control electronics and/or protection electronics for the semiconductor circuit on which the semiconductor circuit arrangements is based and/or for the semiconductor module being provided in the cover element, wherein a module contact comprises a compression spring, and an associated board contact is in the form of a surface contact, and wherein the heat sink as a thread, which matches the screw, in its attachment hole for the screw.

19. The semiconductor circuit arrangement of claim 17, comprising wherein the board has a DCB substrate.

20. The semiconductor circuit arrangement of claim 17, comprising wherein the board has a PCB structure.

21. The semiconductor circuit arrangement of claim 17, comprising wherein the semiconductor circuit arrangement is configured as a power semiconductor circuit arrangement.

22. The semiconductor circuit arrangement of claim 17, comprising wherein the semiconductor module is a power semiconductor module.

23. The semiconductor circuit arrangement of claim 17, comprising wherein the semiconductor module is formed with or from at least one element from the group which is formed from IGBTs, MOSFETs, thyristors, ICs and diodes.

24. A semiconductor circuit arrangement comprising:
a board with at least one board contact;
a semiconductor module with at least one module contact;
at least one screw configured for attachment of the semiconductor module to the board;
with each module contact being associated with one board contact;
with a heat sink being provided to cool at least the semiconductor module;
with a mechanical and electrical contact being made being made between the board contact and the associated module contact on the one hand, and with a mechanical and thermal contact and an attachment being made between the semiconductor module and the heat sink, on the other hand, at the same time by attachment by using the screw;
with a cover element being provided between the board and the head of the screw;
with the head of the screw being supported on the cover element—in particular recessed in its upper face; and
with control electronics and/or protection electronics for the semiconductor circuit on which the semiconductor circuit arrangement is based and/or for the semiconductor module being provided in cover element, wherein a module contact comprises a compression spring, and an associated board contact is in the form of a surface contact, and wherein a head of the screw is supported on the upper face of the board, recessed in an upper face of the cover element, and an upper face of the semiconductor module is fit on a lower face of the board.

25. The semiconductor circuit arrangement of claim 17, comprising wherein an upper face of the heat sink is fit to a lower face of the semiconductor module.

26. The semiconductor circuit arrangement of claim 17, comprising wherein a lower face of a cover element is fit on an upper face of the board, with the head of the screw being supported on the upper face of the cover element.

* * * * *